Nov. 15, 1960 R. EMEIS 2,960,419

METHOD AND DEVICE FOR PRODUCING ELECTRIC SEMICONDUCTOR DEVICES

Filed Jan. 29, 1957 2 Sheets-Sheet 1

Nov. 15, 1960 R. EMEIS 2,960,419

METHOD AND DEVICE FOR PRODUCING ELECTRIC SEMICONDUCTOR DEVICES

Filed Jan. 29, 1957 2 Sheets-Sheet 2

United States Patent Office 2,960,419
Patented Nov. 15, 1960

2,960,419

METHOD AND DEVICE FOR PRODUCING ELECTRIC SEMICONDUCTOR DEVICES

Reimer Emeis, Pretzfeld, Germany, assignor to Siemens-Schuckertwerke Aktiengesellschaft, Berlin-Siemensstadt, Germany, a corporation of Germany Filed Jan. 29, 1957, Ser. No. 637,029

Claims priority, application Germany Feb. 8, 1956

15 Claims. (Cl. 148—1.5)

My invention relates to a method and apparatus for the production of electric semiconductor devices. It is particularly directed to a method of joining, by alloying or diffusion, one or more metallic electrodes of the device with a crystalline, or essentially monocrystalline, semiconductor body. The semi-conductor body may comprise germanium or silicon, or it may be an intermetallic compound or alloy of elements of the third and fifth groups respectively of the periodic system; for example InSb, InAs, AlAs, and GaP.

When the electrode metal is melted for the purpose of forming an alloy over the area of junction with the semi-conductor substance, a uniform wetting of the semi-conductor area by the liquefied electrode metal is necessary in order to obtain an alloy layer of uniform thickness. Such uniform wetting is difficult to obtain. For example, molten aluminum tends to form a skin of oxide. For fashioning electrodes on germanium or silicon, gold is often preferred as a carrier of doping substances such as indium or antimony, preferably with a dope content of approximately 1%; but gold when being melted tends to form drops, because of which the resulting depth of penetration of the alloyed junction layer is non-uniform.

Such difficulties can be overcome by placing the electrode metal, in form of a foil, on the crystalline semi-conductor body and then exerting mechanical pressure upon the foil by means of a pressing body whose pressing surface is plane and is parallel to the area of the semi-conductor substance to be alloyed. This method, however, may result in squeezing off the molten electrode metal laterally.

It might be supposed that a plurality of electrodes could be simultaneously joined and alloyed with a semi-conductor body by using a rigid mold adapted to conform with the shape of the semiconductor body, and clamping the parts of the mold together, after the semiconductor and the electrode foils are inserted, but prior to inserting the assembly into the melting furnace. However, such rigid molds are difficult to manufacture with the required accuracy, particularly if semiconductors of complicated shape are involved whose electrodes are partly mounted in grooves of the semiconductor surface.

It is an object of my invention to eliminate such difficulties and to improve and simplify the manufacture of the semiconductor devices.

To this end and in accordance with one form of my invention, I prepare the assembly of semiconductor substance and electrode metal for performance of the alloying process by embedding these assembled components in a powder consisting of a substance which does not react with the components of the embedded assembly at the temperatures occurring. Such inert substances are graphite and also magnesium oxide, aluminum oxide and other ceramic or refractory or high-melting pulverulent materials. Mixtures may be employed, for example, of graphite and magnesium oxide. Thereafter, the assembly of semiconductor body and electrode metal is compressed while embedded within the inert powder. During the pressing operation, the powder forms a mold which adapts itself to the embedded assembly and imposes thereon a uniform pressure from all sides similar to the pressure occurring within a compressed fluid or liquid. As a result, the mutual positions of the individual components of the embedded assembly are preserved during the subsequent heating and melting of the electrode material. As a consequence, the desired uniform thickness of the alloyed intermediate layer is secured, as well as the exterior shape. For example, the surface shape of the electrode is preserved, because the uniform pressure from all sides exerted by the powder prevents the lateral escape of the electrode material.

The above embodiment of the process can be carried out by placing the predetermined amount of powder, with the semi-conductor and electrode assembly embedded therein, in a rigid hollow mold of simple shape, for example, in a metallic hollow cylinder whose open ends are closed by disk shaped cylindrical pressure plungers, which are preferably of solid graphite. The pressure plungers can be provided with longitudinal bores or channels for the escape of evolving gases.

A simplification of the above method, and of the device employed in that method, is possible where the component parts of the semiconductor assembly located beneath the semi-conductor disk have the same or a larger surface area than the semi-conductor disk itself. As a rule, the lower electrode can be made of a sufficient size for this purpose. In accordance with this aspect of the invention, in such case the semi-conductor assembly is placed upon or against a rigid, planar, supporting or abutting surface and is surrounded only from above or from the opposite side by the embedding powder. The operation for producing such a unilateral embedding is even simpler and more easily effected than with an embedding from all sides. Embedding by pressing the powder from only one side also avoids vertical displacements which may occur when embedding from all sides. Such displacement may take place if the lower bed, prior to placing the assembly thereupon, is not densely packed uniformly over the entire horizontal cross section. Such displacements may result in breaking of semiconductor disks if they are very thin, when the embedded assembly is pressed together with or within the embedding mass. Consequently, a unilateral embedding is particularly well suited for very thin semiconductor disks, which are preferred for transistors.

Several preferred embodiments of the process and apparatus are illustrated in the drawing, in which Figs. 1 to 5 illustrate the first described embodiment and Figs. 7 to 8 the second embodiment. The figures are vertical sections in which:

Figure 1:
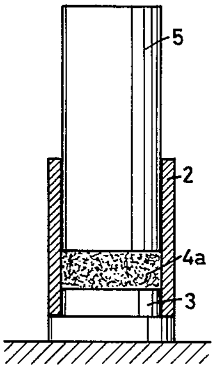
Fig. 1 illustrates the initial operation to form a self-supporting pellet of the powder.
Figure 2:
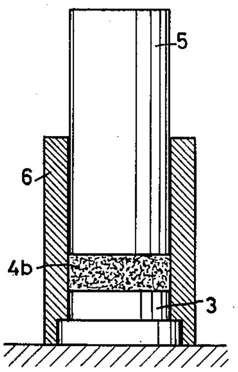
Fig. 2 illustrates the second step, to form the second and upper self-supporting pellet of the powder.
Figure 3:
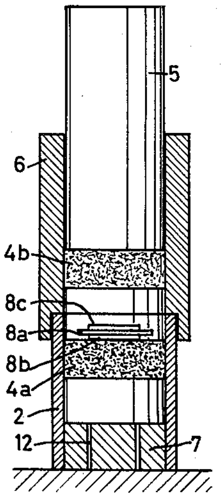

Fig. 3, also partly in section, illustrates the two parts of the apparatus in engagement with each other during a stage of the method subsequent to those represented in Figs. 1 and 2.

Figure 4:
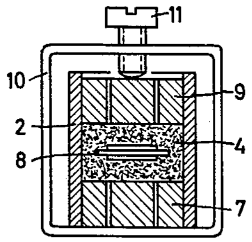

Fig. 4 illustrates, partly in section, the apparatus shown in Figs. 1 to 3, but in a still later stage of the process.

Figure 5:
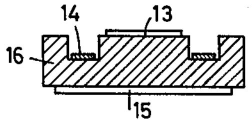

Fig. 5 shows in cross section a semiconductor device of relatively complicated grooved form provided with several component electrodes. The device is a type that can be readily manufactured with the aid of the method and apparatus described.

Figure 6:
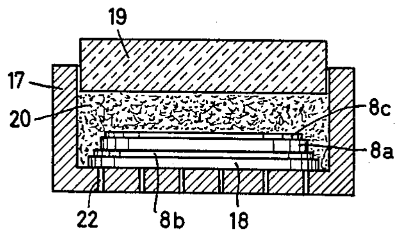

Fig. 6 illustrates an embedded assembly which is to be alloyed together in order to form a rectifier element. About one-half of the assembly is embedded in magnesium oxide powder.

Figure 7:
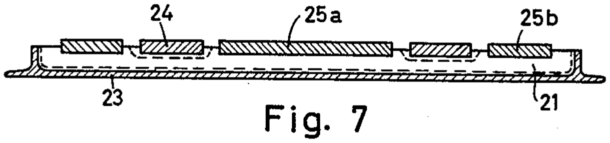

Fig. 7 shows a transistor element produced according to the invention, and

Figure 8:
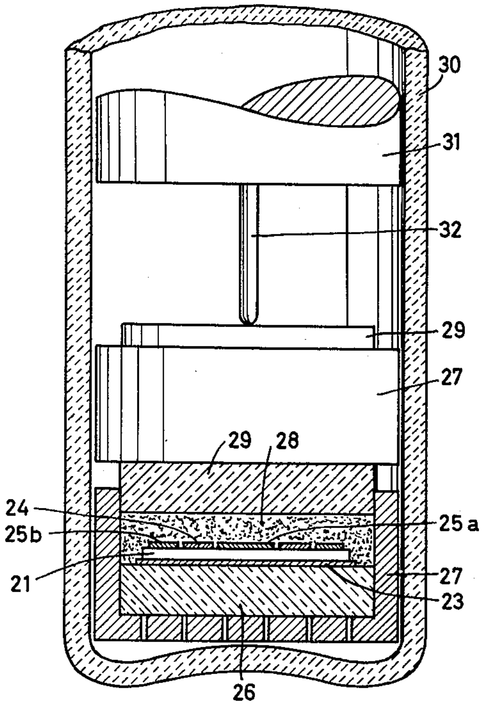

Fig. 8 illustrates several units inserted within a quartz tube which is loaded by a weight.

In Fig. 1 is shown a tubular piece 2 of metal, for instance of steel or brass, in place upon a shoulder portion of a closely fitting bottom plug 3 of the same material. Placed upon the bottom is a quantity of graphite powder 4*a*, preferably colloidal graphite, which is compressed under moderate pressure by means of a steel or brass plunger 5, to form a coherent and self-supporting pellet 4*a*. After the pellet 4*a* is thus produced, the plunger 5 and the bottom 3 are removed, and the tubular piece 2 is turned upside down so that the tube end located near the pellet 4*a* is located at the top of tube 2, as shown in Fig. 3. A second pellet 4*b* is separately produced in the same manner by means of a second tubular piece 6 which has the same inner diameter as the tubular piece 2 but has a larger wall thickness. The tubular piece 6 has an inner shoulder at one end so dimensioned that it fits on the thinner-walled piece 2, as is apparent from Fig. 3. As shown in Fig. 2, the tubular member 6 is placed upon the bottom plug 3 which fits closely into the shouldered end of member 6. Thereafter a predetermined quantity of graphite powder is poured into the tubular member 6 and is then compressed by means of the plunger 5 into a pellet 4*b*. The plunger 5 is then removed and tube 6 placed on tube 2.

After the pellets 4*a* and 4*b* are prepared in the above-described manner, the tubular member 2 with pellets 4*a* is placed over a graphite piston 7 which may be sawed off a graphite rod and may be provided with a few narrow gas channels 12 as illustrated in Fig. 3. The individual components 8*a*, 8*b*, 8*c*, preferably circular, comprising the semi-conductor and the electrode assembly, can now be placed upon the readily accessible top surface of the pellet 4*a*. That is, the components are loosely placed upon the pellet, preferably in a concentric arrangement. By way of example, the components comprise an aluminum foil 8*b* whose thickness is approximately 0.05 mm. and whose diameter is approximately 9 mm. On top of the aluminum foil is placed a disk of p-conducting silicon 8*a*, for instance of approximately 0.4 mm. thickness and a diameter of approximately 10 mm. Placed on top of the silicon disk is a gold foil 8*c* with a content of approximately 1% antimony, a thickness of about 0.05 mm., and a diameter of approximately 9 mm. After these components of the semi-conductor device are assembled, the tubular member 6 with the pellet 4*b* is placed upon the upper end of the tubular member 2. Thereafter the plunger 5 is inserted from above and is slowly forced downwardly so that the pellet 4*b*, and subsequently also the inserted assembly 8*a* to 8*c* and the pellet 4*a*, are pushed downwardly onto the plunger 7. Thereafter a stronger pressure is applied to the piston 5. As a result the pellets 4*a* and 4*b* are deformed until, according to Fig. 4, the embedded assembly 8 is surrounded on all sides by the graphite powder, which then forms a uniform bedding. After removing the pressure plunger 5 and the upper tubular member 6, the upper end of the tubular member 2 is closed by means of a second graphite piston 9, as illustrated in Fig. 4. The entire device can be kept together by means of an elastic clamping frame 10 which is preferably provided with a pressure screw 11 to adjust the desired amount of compression.

With such a device and in accordance with the method of the present invention, it is possible to readily produce complex semiconductor devices having more than two electrodes. Thus, Fig. 5 shows, on an enlarged scale, the cross-section of a transistor consisting of a semiconductor disk 16 with grooves in which the component of an emitter electrode 14 are located, the base electrode 13 being placed upon the upwardly projecting middle portion of the disk and the collector electrode 15 being mounted on the bottom side of the semiconductor body.

To join the components of the assembly and form an alloy between the electrode metal and the semiconductor substance, the device according to Fig. 4, containing the semiconductor and electrode assembly embedded in an inert powder, is inserted into a furnace, preferably an electrically heated furnace, and subjected to the temperature required for the formation of the alloy. In the above-mentioned example of a p-type silicon disk with an aluminum foil on one side and an antimony-containing gold foil on the other side of the disk, good results are obtained by heating the assembly up to a temperature of 800° C. In the example described, the supply of heating powder was discontinued 30 seconds after this temperature was attained. After cooling the assembly down to 250 to 200° C., the material was removed from the furnace.

Instead of using the above-mentioned types of powder each consisting of a single substance, the process can also be carried out with powder mixtures of suitable materials. It is in some cases particularly advantageous to admix with the refractory powder a substance capable of combining with oxygen. Graphite is one example of such substance. In this case the heating may even be carried out in the ambient air atmosphere, whereas in other cases it is preferable to perform the heating in vacuum or in a protective gas atmosphere. When a pure form of graphite powder was used, satisfactory formation of an alloy was also obtained by heating in ordinary atmosphere. Graphite can be employed with germanium, silicon, and the described $A_{III}B_{V}$ compounds.

The embodiments illustrated in Figs. 6, 7, and 8 will now be described in detail.

Referring to Fig. 6, the bottom plate of an iron container 17, suitable for receiving the embedding powder, serves directly as support for the assembly to be embedded. Such metal support can generally be used if the lower face of the inserted assembly consists of or comprises a metal which does not alloy, weld or solder together with the metal of the planar supporting surface, in any case not at the processing temperature required for the alloying-together of the semiconductor assembly, this temperature being approximately 800° C. for silicon and somewhat lower, namely about 500 to 600° C., for germanium.

Suitable supporting metals for silicon are, for example, molybdenum and tungsten which, at the above-mentioned temperatures, readily form a suitable alloy with aluminum without impairing the simultaneous formation of an alloy of aluminum and silicon. Accordingly, in the assembly shown in Fig. 6 the carrier plate 18 consists of molybdenum and has a planar surface. The molybdenum disk 18 is preferably plated on its lower face with a thin coating of Vakon (Kovar) which, during the subsequent heat processing is neither welded nor soldered together with the metal of the support, that is, the bottom plate of the iron container 17. This coating makes it possible to subsequently join connecting leads, cooling vanes and other metallic structural parts with the carrier plate 18 by means of a customary soft solder. The molybdenum disk 18 has, for example, a thickness of 0.5 mm. and a diameter of 11 mm. The Vakon (Kovar) plating on the bottom side may have a thickness of 0.02 mm. Located above the carrier plate 18 is a semiconductor disk 8*a* of p-conductive silicon of the same dimensions as described with reference to Fig. 3 and with the same aluminum foil 8*b* and gold-antimony foil 8*c* located on the opposite sides, except that the diameter of the aluminum foil 8*b* should not be smaller than the diameter of the silicon disk 8*a*, and not larger than the diameter of the carrier plate 18.

If the semiconductor disk consists, for example, of n-conducting germanium, it is preferably alloyed on its upper side with indium, with the result that, in this case, too, the p-n junction does not form in the vicinity of the lower side covered by the carrier plate but rather in the vicinity of the free upper side of the germanium disk where it is subsequently readily accessible. This accessibility is useful, for example, for the purpose of subsequently etching the outer p-n boundary at which the p-n junction surface emerges at the surface of the semiconductor disk. To provide barrier-free contact with the germanium disk, an antimony-containing gold foil may be used at the lower side of the disk. The choice of a suitable material for the carrier plate offers considerably less difficulty with germanium than with silicon because germanium is far less brittle. Many suitable materials are generally known for such germanium-semiconductor techniques. Iron is a suitable example, the iron plate being plated on its upper side by nickel and gold, such plating being carried out, for example, by vaporizing the plating metals onto the iron surface, or by electroplating. The lower side of the iron disk may also be coated with a suitable metal which permits the soldering of connecting leads or metallic structural parts by means of a customary soft solder.

The assembly composed of the parts 8*a*, 8*b*, 8*c* and 18, located within the container 17 of Fig. 6, is covered with a layer 20, for instance of magnesium oxide powder, inserted from above. The layer is firmly and uniformly pressed by means of a rigid disk 19, which is of graphite, for example. Thereafter, a subsequent heat processing of the kind and course described above is employed to alloy together the entire rectifier assembly shown in Fig. 6 in a single operation. To permit any evolving gases to escape, the bottom of container 17 is preferably provided with a number of spaced narrow bores 22.

The entire container 17 may be made of other suitable materials. For example, the container may be of ceramic material, and its bottom can be ground after firing to completely planar shape. It can be formed from a solid graphite rod of the required diameter, the vessel being machined out of the rod on a lathe. Instead of the described bottom plate of container 17, a special supporting structure may be used. Such a supporting structure may consist of a neutral powder, such as magnesium oxide or graphite powder, the layer of powder being pre-pressed under high pressure in order to provide a sufficiently solid surface. A fired ceramic disk ground to planar shape may also be used. Or disks a few millimeters thick, such as 5 to 10 mm., may be cut from a solid graphite rod, and may be machined by turning on a lathe to planar shape, and used as a supporting structure.

The transistor device of Fig. 7 comprises a disk-shaped basic semiconductor body 21 of p-conductive silicon and a collector electrode 23 disposed on the lower side of the silicon disk consisting of gold-containing antimony. In producing such a transistor device it is preferable to avoid a simultaneous bonding of the device with a carrier plate of molybdenum or tungsten, because this would entail the danger that, during processing at the mentioned temperature of about 800° C., the formation of the p-n junction might be impaired by molybdenum or, to a lesser degree, by tungsten which may enter into the body by becoming dissolved in the gold-antimony-silicon alloy. However, it has been found that when using a gold foil whose thickness is one-third of that of the silicon disk or more, the fact that the thermal coefficient of expansion of gold is different from that of silicon may cause mechanical tensions. For example, when semiconductor elements having a disk diameter of 10 mm. or more and having a thickness of the semiconductor body of 0.1 are employed, a curved shape may result after cooling, due to such tensions. Such mechanical tensions, even if they do not result in cracks or breaking of the silicon body, are apt to have detrimental effects upon the lattice structure and the electrical properties of the semiconductor element. To be sure, the mentioned mechanical tensions can be avoided by the use of thinner gold foils, because then the gold alloy becomes stretched during cooling. However, it has been observed that when such extremely thin gold foils are used, for example of 0.025 mm. or less, the alloy is often defective.

The above-mentioned difficulties, however, are avoided when a rigid support is used and the compressing pressure applied during the heat processing is increased, thus permitting the use of a relatively thick gold foil without detrimental effects. This is so because at a pressure of about 1 kilogram per square centimeter (kg./cm.$^2$) or more, the gold foil is pressed at least in part into the fine pore openings on the upper side of the rigid support of graphite, magnesium oxide or ceramic. As a result, the gold-containing layer of alloy, during the cooling following the heat processing, is subject to a uniform adherence force over its entire area and is thus compelled to stretch, and so is prevented from shrinking in the two dimensions of the semiconductor plane. The semiconductor assembly resulting after the completed processing consequently does not possess detrimental mechanical tensions.

In this manner the invention has been employed to produce, for example, semiconductor elements of p-conducting silicon having a 0.1 mm. thickness and 12 mm. diameter with a gold-antimony foil of approximately 0.04 mm. thickness, both foil and silicon being alloyed together perfectly without any discernable change in shape. This has been accomplished also with simultaneously alloyed emitter and base electrodes made of gold-antimony foil and aluminum foil respectively, the alloying of these substances being simultaneously effected within an embedding body of powder according to the invention, the foils having the shape of concentric rings. The resulting transistor elements were found to be of highest quality. The arrangement of the emitter electrode and base electrode is apparent from Fig. 7. The ring-shaped emitter electrode is denoted by 24. In front of this electrode, in the direction toward the interior of the silicon body 21, there exists a p-n junction which is indicated in the cross-sectional illustration by broken lines. A similarly arranged p-n junction is also located ahead of the collector electrode 23. It has been observed that, when the components are alloyed together, the electrode metal of the collector electrode pulls itself upwardly at the rim of the thin silicon disk so that the p-n junction of the collector electrode becomes exposed at the free surface on the upper side of the silicon disk. Consequently, this junction is readily observable and conveniently accessible when the transistor element, in the known manner, is fastened with its lower side upon another structural component or connecting lead, for instance upon a cooling vane or upon the bottom of the housing. The base electrode of the transistor element according to Fig. 7 consists of an inner circular part 25*a* and an outer ring-shaped part 25*b*. Between these two parts, on the one hand, and the ring-shaped emitter electrode 24, on the other hand, there are ring-shaped intermediate spaces whose width is from about 0.05 to 0.1 mm., the width being made as uniform as possible about the entire periphery. Connecting leads can be attached to parts 24, 25*a* and 25*b* by soldering with the aid of soft solder.

In the lower portion of Fig. 8 is illustrated the preparation of an inserted assembly for the production of the transistor element or device of Fig. 7. An insert 26 of aluminum oxide powder is pressed into an iron container 27 which has a perforated bottom. The pressure used for pressing the aluminum oxide layer is sufficiently great to form a rigid, completely planar, supporting surface. A gold-antimony foil 23 is first placed upon the supporting surface, the diameter of the foil being preferably made somewhat larger than the diameter of the silicon disk 21 located above the foil. Placed upon the upper side of the silicon disk 21 is a circular aluminum foil 25*a*, a ring-shaped gold-antimony foil 24, and a likewise ring-shaped aluminum foil 25*b*. Placed upon this inserted assembly, from above, is a bed or pellet 28 of graphite powder particles which are pressed together, and down upon the transistor device, by means of a rigid graphite disk 29 located above the powder.

As shown in Fig. 8, several of the devices described above, can be stacked one above the other in a tube 30 of suitable length, and consisting preferably of quartz, only a portion of this tube being illustrated in Fig. 8, in section. In Fig. 8, only two such devices are illustrated, two iron containers 27 being shown. However, ten or more such devices may be used together in order to form a single thermos charge. To provide the required compressing force a cylindrical metal weight 31 fitting into the quartz tube 30 is used, only a portion of the metal piece 31 being visible in Fig. 8. Between the weight 31 and the graphite disk 29 of the uppermost device, is a mandril 32 which may be secured to the weight 31 and which serves to secure a centered transmission of pressure. The comparatively narrow mandril 32 is a poor heat conductor, or a heat-conduction impedance. This prevents the dissipation, from the embedding devices through the weight 31, of so much heat to a colder zone of the heating furnace as could impair the uniformity of the processing temperature of the components of the furnace charge. The mandril 32 consists preferably of a material of slight heat conductance, being for example a tube of ceramic material. The upper end of the quartz tube 30, not shown in Fig. 8, is preferably provided with a ground connection for the gas-tight attachment of a vacuum pump with the aid of which the quartz tube can be evacuated after being placed in the heating furnace in such a manner that the upper end protrudes from the furnace. In this way the vacuum in tube 30 can be maintained during the processing period.

I claim:

1. A process of making a semiconductor device comprising at least partly embedding an electrode material and a plate of monocrystalline semiconductor material in contiguous relation in a comminuted material compacted at least partly thereabout and applying heat sufficient to alloy the electrode material to the semiconducor, the comminuted material being one which does not react with the electrode material and the semiconductor material and does not melt in the process, the said heating being to a temperature below the melting point of the semiconductor, the comminuted material being under compacting pressure, during said heating, at least sufficient to immobilize the electrode and plate with respect to each other.

2. The process of claim 1 in which the comminuted material is taken from the group consisting of graphite and ceramic materials and the semiconductor material is taken from the group consisting of silicon, germanium, InSb, InAs, AlAs, and GaP.

3. A process of making a semiconductor device comprising supporting a carrier body in a housing structure, said carrier body providing a flat form-retaining surface, disposing against said carrier body a sandwich comprising a semiconductor plate having electrode foils on respective opposite faces thereof, pressing a body of comminuted material upon the sandwich to substantially immobilize it in the housing structure while applying heat sufficient to alloy the electrodes to the semiconductor, said heating being at a temperature below the melting point of the semiconductor.

4. The process of claim 3 in which the carrier body is formed of a comminuted ceramic material pre-compressed sufficiently to retain its flat surface in the processing.

5. The process of claim 3 in which the sandwich comprises an aluminum foil on one side, an intermediate silicon semiconductor, and gold-antimony foil and aluminum foil on the other side, the comminuted material being pressed about the said other side.

6. The process of claim 3 in which the body of comminuted material is taken from the group consisting of carbon, magnesium oxide, and aluminum oxide, and the semiconductor is taken from the group consisting of germanium, silicon, and $A_{III}B_V$ semiconductor intermetallic compounds and alloys.

7. The process of claim 3 in which the electrode foil disposed against the carrier body is at least co-extensive in surface area with the semiconductor wafer, said pressing being transverse to the flat form-retaining surface of the carrier body.

8. A process of making a semiconductor device comprising supporting a carrier plate of a material of the group consisting of tungsten and molybdenum in a housing structure, disposing an aluminum foil electrode in contiguous relation to the said plate, disposing an extended surface of a semiconductor wafer of silicon in contiguous relation to the aluminum foil, and an electrode foil of gold containing antimony in contiguous relation to the opposite surface of the wafer, covering the gold foil and exposed parts of the silicon wafer and the aluminum foil by pressing thereabout a body of comminuted material which does not react with the electrode material and the semiconductor material and does not melt in the process, while applying heat sufficient to alloy the electrodes to the semiconductor, at a temperature below the melting point of silicon.

9. A process of making a semiconductor device comprising at least partly embedding an electrode material and a thin, integral plate of monocrystalline semiconductor material in contiguous relation in a comminuted material compacted at least partly thereabout, applying pressure to the comminuted material from only one direction, which direction is transverse to and toward the plate surface contiguous to the electrode, while applying heat sufficient to alloy the electrode material to the semiconductor, the comminuted material being one which does not react with the electrode material and the semiconductor material and does not melt in the process, the temperature of said heat application being below the melting point of the semiconductor, said pressure being at least sufficient to immobilize the plate and electrode with respect to each other.

10. A process of making a semiconductor device, the device comprising a recessed, thin, monocrystalline semiconductor plate and an electrode carried in the recess, comprising embedding the electrode and plate in contiguous relation in a comminuted material compacted thereabout, and applying compacting pressure to said material from a direction which is transverse to and toward the plate surface contiguous to the electrode, while applying heat sufficient to bond and alloy the electrode to the semiconductor plate, said pressure being at least sufficient to immobilize the electrode and plate with respect to each other, the comminuted material being one which does not react with the electrode material and the semiconductor material and does not melt in the process, the heating being such that at least the main body of the semiconductor remains solid.

11. A process of making a semiconductor device comprising forming a pellet of a comminuted material in a tubular member, forming a second pellet of a comminuted material in a second tubular member, disposing an electrode material and an integral plate of monocrystalline semiconductor material in contiguous relation with each other on the first pellet, superposing the two tubular members so that the electrode and semiconductor materials are between the two pellets, ramming the second pellet down against the first pellet to embed the electrode and semiconductor in the comminuted material, and thereafter applying compacting pressure from only one direction, which direction is transverse to the plate surface contiguous to the electrode, while applying heat sufficient to alloy the electrode material to the semiconductor, the comminuted material being one which does not react with the electrode material and the semiconductor material and does not melt in the process, the said heat application being such that at least the main body of the semiconductor remains solid, said compacting pressure being at least sufficient to immobilize the electrode and semiconductor with respect to each other.

12. A process of making a semiconductor device comprising at least partly embedding an electrode material and a plate of monocrystalline semiconductor material in contiguous relation in a comminuted material compacted at least partly thereabout and applying heat sufficient to alloy the electrode material to the semiconductor, the comminuted material being one which does not react with the electrode material and the semiconductor material and does not melt in the process, the said heating being to a temperature below the melting point of the semiconductor, the comminuted material being under compacting pressure, during said heating, at least sufficient to immobilize the electrode and plate with respect to each other, said semiconductor material being silicon, the electrode being formed of gold alloyed with a doping substance, the gold alloy having a molten phase at a temperature below the melting point of silicon, the heating being at least to said latter temperature.

13. The process of claim 12, the doping substance being antimony.

14. A process of making a semiconductor device comprising at least partly embedding an electrode material and a plate of monocrystalline semiconductor material in contiguous relation in a comminuted material compacted at least partly thereabout and applying heat sufficient to alloy the electrode material to the semiconductor, the comminuted material being one which does not react with the electrode material and the semiconductor material and does not melt in the process, the said heating being to a temperature below the melting point of the semiconductor, the comminuted material being under compacting pressure, during said heating, at least sufficient to immobilize the electrode and plate with respect to each other, said semiconductor material being germanium, the electrode being formed of gold alloyed with a doping substance, the gold alloy having a molten phase at a temperature below the melting point of germanium, the heating being at least to the latter temperature.

15. The process of claim 14, the doping substance being antimony.

References Cited in the file of this patent

UNITED STATES PATENTS

| | | |
|---|---|---|
| 2,510,546 | Brennan | June 6, 1950 |
| 2,721,965 | Hall | Oct. 25, 1955 |
| 2,725,288 | Dodds et al. | Nov. 29, 1955 |
| 2,743,201 | Johnson et al. | Apr. 24, 1956 |
| 2,756,483 | Wood | July 31, 1956 |
| 2,757,440 | Carman | Aug. 7, 1956 |
| 2,761,800 | Ditrick | Sept. 4, 1956 |
| 2,791,524 | Ozarow | May 7, 1957 |